United States Patent
Yamamoto et al.

(10) Patent No.: US 9,450,380 B2
(45) Date of Patent: Sep. 20, 2016

(54) SEMICONDUCTOR LASER LIGHT SOURCE

(71) Applicant: MITSUBISHI ELECTRIC CORPORATION, Tokyo (JP)

(72) Inventors: Shuhei Yamamoto, Tokyo (JP); Akira Nakamura, Tokyo (JP); Kazutaka Ikeda, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 14/550,613

(22) Filed: Nov. 21, 2014

(65) Prior Publication Data

US 2015/0263487 A1    Sep. 17, 2015

(30) Foreign Application Priority Data

Mar. 12, 2014   (JP) .................................. 2014-049116

(51) Int. Cl.
  *H01S 5/00*  (2006.01)
  *H01S 5/20*  (2006.01)
  *H01S 5/022*  (2006.01)

(52) U.S. Cl.
  CPC ............... *H01S 5/20* (2013.01); *H01S 5/0224* (2013.01); *H01S 5/02272* (2013.01)

(58) Field of Classification Search
  CPC .... H01S 5/20; H01S 5/0224; H01S 5/02272; H01S 5/02256; H01S 5/02244; H01S 5/02467
  USPC ...................................................... 372/44.01
  See application file for complete search history.

(56) References Cited

U.S. PATENT DOCUMENTS

| | | | |
|---|---|---|---|
| 4,817,849 A * | 4/1989 | Yamamoto .......... | H01S 5/02252 156/64 |
| 5,285,463 A | 2/1994 | Takuma | |
| 6,804,276 B2 * | 10/2004 | Gen-ei .................. | G11B 7/127 372/36 |
| 2004/0201029 A1 * | 10/2004 | Yamane ................. | H01L 24/83 257/99 |
| 2006/0249745 A1 * | 11/2006 | Chae ..................... | B82Y 20/00 257/99 |

FOREIGN PATENT DOCUMENTS

| | | |
|---|---|---|
| DE | 10 2010 009 466 A1 | 9/2011 |
| JP | 5-190973 A | 7/1993 |
| JP | 2002-359425 A | 12/2002 |
| JP | 2002-369427 A | 12/2002 |
| JP | JP 2003-092431 A | 3/2003 |

* cited by examiner

*Primary Examiner* — Tuan Nguyen
(74) *Attorney, Agent, or Firm* — Birch, Stewart, Kolasch & Birch, LLP

(57) ABSTRACT

A sub-mount includes a sub-mount substrate, an Au layer placed above the sub-mount substrate, a barrier layer which is placed on the Au layer and has a barrier portion at least in a portion of its outer peripheral portion which is other than a portion corresponding to a side of an output end of a semiconductor laser, and a solder layer placed on the barrier layer in an area surrounded by the barrier portion, wherein the semiconductor laser is bonded to the sub-mount through the solder layer, in a state where the semiconductor laser is spaced apart by a predetermined interval from an inner surface of the barrier portion, and further, the output end protrudes, in a direction of output of the laser light, from an end of the solder layer which corresponds to the side of the output end of the semiconductor laser.

5 Claims, 4 Drawing Sheets

SEMICONDUCTOR LASER LIGHT SOURCE

BACKGROUND OF THE INVENTION

1. Field of the Invention

The present invention relates to high-output semiconductor laser light sources including a high-output semiconductor laser and a sub-mount which are bonded to each other and, more particularly, relates to structures capable of efficiently dissipating heat generated from a semiconductor laser through a sub-mount for improving output characteristics and reliability of a semiconductor laser light source.

2. Description of the Background Art

Semiconductor lasers output laser light and also generate heat during operations. In general, semiconductor lasers exhibit improved output characteristics and improved reliability at lower temperatures and, therefore, it is important to dissipate heat therefrom. As heat sinks for heat dissipation, there have been utilized members made of high-heat-radiation metal materials (for example, Cu). However, such heat sinks made of Cu and the like have linear expansion coefficients larger than semiconductor lasers, which makes it harder to directly bond them to each other. Therefore, in general, a semiconductor laser is bonded to a sub-mount made of a material having a linear expansion coefficient with a value between those of a heat sink and the semiconductor laser, and the sub-mount is bonded to the heat sink.

In such cases, for bonding a semiconductor laser to a sub-mount, there have been structures which place an Au layer on the bonding surface of the semiconductor laser and, further, place an Au/Pt/AuSn solder layer on the sub-mount, for bonding them to each other.

For example, Japanese Patent Application Laid-Open No. 5-190973 (1993) discloses a structure having a semiconductor laser and a sub-mount which are bonded to each other, wherein the sub-mount includes a sub-mount substrate, a Ti layer, a Pt layer and an Au layer which are placed on the sub-mount substrate, and a Pt layer and an AuSn solder layer which have the same length as that of the semiconductor laser and are placed on the upper surface of the Au layer.

For example, Japanese Patent Application Laid-Open No. 2002-359425 discloses a structure having a semiconductor laser and a sub-mount which are bonded to each other, wherein the sub-mount includes a sub-mount substrate, a Ti/Pt layer and an Au layer which are placed on the sub-mount substrate, a barrier layer which has a length smaller than that of the semiconductor laser and is placed on the upper surface of the Au layer, and a solder layer formed to cover the barrier layer.

SUMMARY OF THE INVENTION

In the structure described in Japanese Patent Application Laid-Open No. 5-190973 (1993), the Pt layer and the AuSn solder layer, which have the same length as that of the semiconductor laser, are placed on the sub-mount substrate, which causes the AuSn solder to spread with wetness toward the Au layer placed over the entire surface of the sub-mount substrate, during the bonding. In this case, there may be induced variations in the members, such as variations in the surface roughness of the sub-mount substrate, and the thickness and the composition ratio of the AuSn solder layer and, also, there may be induced variations in the bonding conditions such as the temperature and the load applied thereto during the bonding.

When there are induced such variations in the members or such variations in the bonding conditions, the amount of the solder on the lower surface of the semiconductor laser is not stabilized, which causes voids on the lower surface of the semiconductor laser. This has induced the problem of degradation of the output characteristics and the reliability of the semiconductor laser light source.

Further, in the structure described in Japanese Patent Application Laid-Open No. 2002-359425, there is placed, on the sub-mount substrate, the solder layer formed to cover the barrier layer (a Pt layer, for example) having a length smaller than that of the semiconductor laser, which causes the AuSn solder to spread with wetness toward the Au layer placed over the entire surface of the sub-mount substrate, during the bonding. This has induced the same problem as that of Japanese Patent Application Laid-Open No. 5-190973 (1993).

It is an object of the present invention to provide a semiconductor laser light source capable of exhibiting improved output characteristics and improved reliability, even when there are variations in members and variations in bonding conditions.

A semiconductor laser light source according to the present invention includes a semiconductor laser having an output end for outputting laser light, and a sub-mount to which the semiconductor laser is bonded. The sub-mount includes a sub-mount substrate, an Au layer placed above the sub-mount substrate, a barrier layer which is placed on the Au layer and has a wall portion at least in a portion of its outer peripheral portion which is other than a portion corresponding to a side of the output end of the semiconductor laser, and a solder layer placed on the barrier layer in an area surrounded by the wall portion. The semiconductor laser is bonded to the sub-mount through the solder layer, in a state where the semiconductor laser is spaced apart by a predetermined interval from an inner surface of the wall portion, and further, the output end protrudes, in a direction of output of the laser light, from an end of the solder layer which corresponds to the side of the output end of the semiconductor laser.

The sub-mount includes the barrier layer which is placed on the Au layer and has the wall portion at least in the portion of its outer peripheral portion which is other than the portion corresponding to a side of the output end of the semiconductor laser, and the solder layer placed on the barrier layer in the area surrounded by the wall portion. The semiconductor laser is bonded to the sub-mount through the solder layer, in the state where the semiconductor laser is spaced apart by the predetermined interval from the inner surface of the wall portion, and further, the output end protrudes, in the direction of output of the laser light, from the end of the solder layer which corresponds to the side of the output end of the semiconductor laser.

Accordingly, when the semiconductor laser is bonded to the sub-mount, a portion of the redundant solder in the solder layer is gathered between the outer peripheral portion of the semiconductor laser and the wall portion in the barrier layer, while a remaining portion of the redundant solder is spread with wetness, toward the portion beneath the output end of the semiconductor laser, which protrudes in the direction of laser-light output. The redundant solder in the solder layer does not spread with wetness up to the side surfaces of the semiconductor laser which are other than the output end, which can stabilize the amount of the solder on the lower surface of the semiconductor laser, even in the event of occurrences of variations in the members or variations in the bonding conditions. This enables dissipating heat from the entire semiconductor laser with higher efficiency, thereby improving the output characteristics and the reliability of the semiconductor laser light source.

These and other objects, features, aspects and advantages of the present invention will become more apparent from the following detailed description of the present invention when taken in conjunction with the accompanying drawings.

DESCRIPTION OF THE PREFERRED EMBODIMENTS

First Preferred Embodiment

Figure 1:
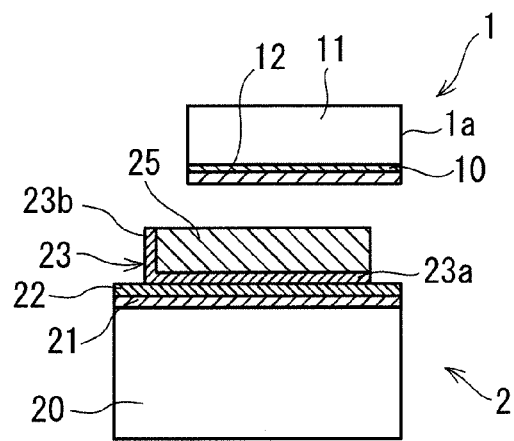
FIG. 1 is a cross-sectional view illustrating a semiconductor laser light source according to a first preferred embodiment in a state where a semiconductor laser has not been bonded to a sub-mount.
Figure 2:
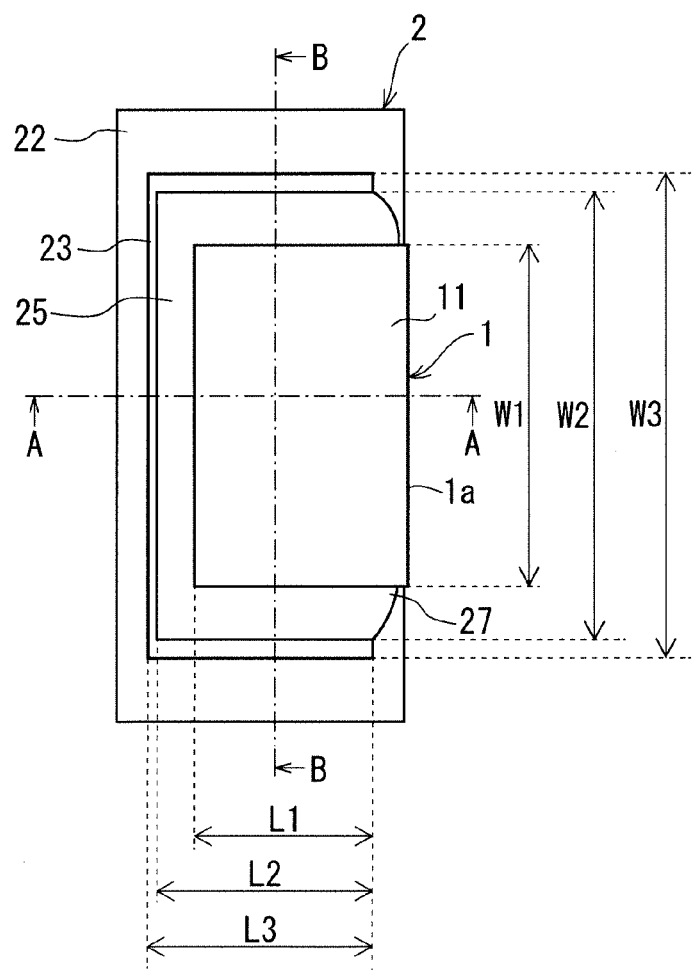
FIG. 2 is a plan view of the semiconductor laser light source according to the first preferred embodiment.
Figure 3:
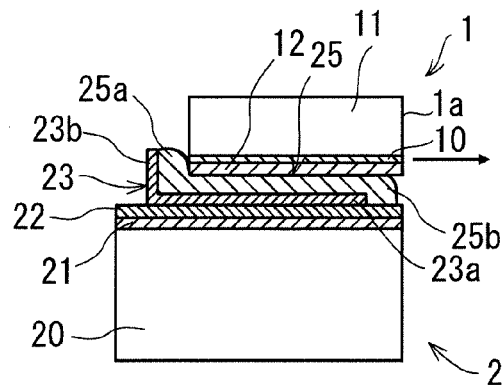
FIG. 3 is a cross-sectional view taken along the line A-A in FIG. 2.
Figure 4:
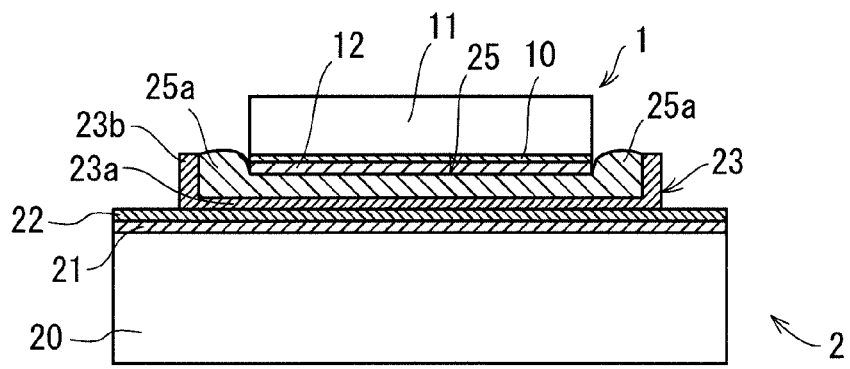
FIG. 4 is a cross-sectional view taken along the line B-B in FIG. 2.

Hereinafter, a first preferred embodiment of the present invention will be described, with reference to the drawings. FIG. 1 is a cross-sectional view illustrating a semiconductor laser light source according to the first preferred embodiment in a state where a semiconductor laser 1 has not been bonded to a sub-mount 2. FIG. 2 is a plan view of the semiconductor laser light source according to the first preferred embodiment. FIG. 3 is a cross-sectional view taken along the line A-A in FIG. 2, and FIG. 4 is a cross-sectional view taken along the line B-B in FIG. 2.

As illustrated in FIG. 1, the semiconductor laser light source includes the semiconductor laser 1 and the sub-mount 2. The semiconductor laser 1 has a multi-emitter structure having plural light emission points, for example. The semiconductor laser 1 includes a semiconductor laser substrate 11, an active layer 10, and an Au layer 12.

The active layer 10 is placed on the lower surface, in FIG. 1, of the semiconductor laser substrate 11. By maintaining the active layer 10 at a lower temperature, it is possible to improve the output characteristics and the reliability of the semiconductor laser light source. Therefore, it is desirable that the semiconductor laser 1 is bonded, in the side of the active layer 10, to the sub-mount 2. The Au layer 12 is placed, for bonding through soldering, on the lower surface of the active layer 10 in the semiconductor laser 1.

The sub-mount 2 includes a sub-mount substrate 20, an intermediate layer 21, an Au layer 22, a barrier layer 23, and a solder layer 25. The sub-mount substrate 20 is desirably formed from a material having a linear expansion coefficient between those of the semiconductor laser 1 and a heat sink (not illustrated). In this case, the heat sink is formed from a high-heat-radiation metal material (for example, Cu). Therefore, the sub-mount substrate 20 is formed from AlN or SiC which is a material having a linear expansion coefficient between those of the semiconductor laser 1 and the heat sink.

The intermediate layer 21 can be either formed to be a Ti-layer/Pt-layer or formed to have a multi-layer structure for the sake of further reduction of the stress exerted on the semiconductor laser 1 in the event of linear expansion. For example, the sub-mount substrate 20 is formed from SiC, and the intermediate layer 21 is formed to be a Ti-layer/Cu-layer/Ni-layer such that the Ti layer exists next to the sub-mount substrate 20. Thus, by adjusting the thicknesses of the respective layers in the intermediate layer 21, it is possible to reduce the stress exerted on the semiconductor laser 1, after the bonding.

The Au layer 22 is placed on the upper surface of the intermediate layer 21. The barrier layer 23 is placed on the upper surface of the Au layer 22, in the area other than the outer peripheral portion. The barrier layer 23 includes a horizontal portion 23a and a barrier portion 23b (a wall portion).

The horizontal portion 23a is formed to have a rectangular shape in a plan view and, further, is placed on the Au layer 22 in the area other than the outer peripheral portion thereof. The barrier portion 23b is provided on the outer peripheral portion of the horizontal portion 23a, at least in the portion thereof other than the portion corresponding to a side of an output end 1a of the semiconductor laser 1. In this case, the output end 1a is the portion for outputting laser light, in the semiconductor laser 1.

More specifically, the barrier portion 23b is formed, on the rectangular-shaped horizontal portion 23a, to have a wall shape protruding upwardly from the outer peripheral portion of the horizontal portion 23a which corresponds to its three sides other than the side coincident with the output end 1a of the semiconductor laser 1. In this case, the barrier layer 23 (namely, the horizontal portion 23a and the barrier portion 23b) can be also formed from Pt. Further, the barrier portion 23b can be also formed by performing vapor deposition of Pt inside a mask formed on the outer peripheral portion of the horizontal portion 23a and, thereafter, applying resist to the mask. The solder layer 25 is placed on the barrier layer 23, in the area surrounded by the barrier portion 23b. The solder layer 25 is formed from AuSn.

As illustrated in FIGS. 2 and 3, the semiconductor laser 1 is bonded to the sub-mount 2 through the solder layer 25, in a state where the semiconductor laser 1 is spaced apart by a predetermined interval from the inner surface of the barrier portion 23b, and further, the output end 1a protrudes, in the direction of laser-light output (in the direction of an arrow in FIG. 3), from the end of the solder layer 25 which coincides with the output end 1a of the semiconductor laser 1.

The semiconductor laser 1, the barrier layer 23 and the solder layer 25 will be described, regarding their widths and lengths. As illustrated in FIG. 2, there is the following relationship between the width W1 of the semiconductor laser 1, the width W2 of the solder layer 25, and the width W3 between the opposite ends of the barrier portion 23b.

$W1 < W2 < W3$

Further, in the semiconductor laser 1, there is the following relationship between the length L1 to the rear end surface of the semiconductor laser 1 from the end of the barrier portion 23b which is closer to the output end 1a, the length L2 therefrom to the barrier portion including the barrier layer 23, and the length L3 of the solder layer 25 before the bonding.

L1<L2<L3

The bonding of the semiconductor laser 1 to the sub-mount 2 is performed, by raising the temperature of the sub-mount 2 to a temperature equal to or higher than the temperature which melts the solder layer 25 and, further, by applying a load to the semiconductor laser 1. Therefore, as illustrated in FIGS. 3 and 4, after the bonding, the solder layer 25 has a thickness reduced from that of the solder layer 25 before the bonding, which causes a partial solder 25a out of the redundant solder in the solder layer 25 to gather between the outer peripheral portion of the semiconductor laser 1 and the barrier portion 23b in the barrier layer 23. In this case, the barrier portion 23b prevents the redundant solder 25a from flowing to the outside of the barrier portion 23b.

For example, in cases where the bonding is performed at a higher temperature, the solder tends to spread widely with wetness, but the barrier portion 23b maintains the amount of the solder on the lower surface of the semiconductor laser 1 constant. Further, when the sub-mount substrate 20 and the intermediate layer 21 have higher surface roughness, the volume of the solder before the bonding may be different from a targeted volume, or the amount of the solder required for filling the concavity and convexity in the surfaces of the sub-mount substrate 20 and the intermediate layer 21 may be varied. Even in these cases, the amount of the solder on the lower surface of the semiconductor laser 1 is maintained constant, through the increase and decrease of the redundant solder 25a.

Further, as described above, the semiconductor laser 1 is bonded to the sub-mount 2 through the solder layer 25, in the state where the output end 1a for outputting laser in the semiconductor laser 1 protrudes, in the direction of laser-light output, from the end of the solder layer 25 which corresponds to the side of the output end 1a. By bonding them at this position, the active layer 10 is not obstructed by the solder layer 25. As an example of the length of the protrusion of the output end 1a of the semiconductor laser 1 from the end of the solder layer 25, the length of the protrusion may be about 20 micrometers. Since the barrier portion 23b does not exist in the side closer to the output end 1a of the semiconductor laser 1, a solder 25b which is a remaining portion of the redundant solder is spread with wetness, toward the portion beneath the output end 1a of the semiconductor laser 1 due to the bonding. Thus, the semiconductor laser 1 is bonded thereto through the solder over its substantially-entire lower surface, which can further improve the output characteristics and the reliability of the semiconductor laser light source.

As described above, in the semiconductor laser light source according to the first preferred embodiment, the sub-mount 2 includes the barrier layer 23 which is placed on the Au layer and has the barrier portion 23b at least in the portion of its outer peripheral portion which is other than the portion corresponding to a side of the output end 1a of the semiconductor laser 1, and the solder layer 25 placed on the barrier layer 23 in the area surrounded by the barrier portion 23b, wherein the semiconductor laser 1 is bonded to the sub-mount 2 through the solder layer 25, in the state where the semiconductor laser 1 is spaced apart by a predetermined interval from the inner surface of the barrier portion 23b, and further, the output end 1a protrudes, in the direction of laser-light output, from the end of the solder layer 25 which corresponds to the side of the output end 1a of the semiconductor laser 1.

Accordingly, when the semiconductor laser 1 is bonded to the sub-mount 2, the partial solder 25a, out of the redundant solder in the solder layer 25, is gathered between the outer peripheral portion of the semiconductor laser 1 and the barrier portion 23b in the barrier layer 23. The solder 25b which is a remaining portion of the redundant solder is spread with wetness, toward the portion beneath the output end 1a of the semiconductor laser 1, which protrudes in the direction of laser-light output. The redundant solder in the solder layer 25 does not spread with wetness up to the side surfaces of the semiconductor laser 1 which are other than the output end 1a, which can stabilize the amount of the solder on the lower surface of the semiconductor laser 1, even in the event of occurrences of variations in the members or variations in the bonding conditions. This enables dissipating heat from the entire semiconductor laser 1 with higher efficiency, thereby improving the output characteristics and the reliability of the semiconductor laser light source.

Due to the improvement of the output characteristics of the semiconductor laser light source, it is possible to reduce the amount of energy consumption in the semiconductor laser light source. Further, due to the improvement of the reliability of the semiconductor laser light source, it is possible to use the semiconductor laser light source for a longer time period. Further, since the amount of the solder on the lower surface of the semiconductor laser 1 is stabilized, it is possible to increase the yield of the semiconductor laser light source.

Further, as described above, when the sub-mount substrate 20 is formed from SiC, and there is provided the intermediate layer 21 which is placed between the sub-mount substrate 20 and the Au layer 22 and is formed from a Ti-layer/Cu-layer/Ni-layer, it is possible to reduce stress strains during the bonding, which are caused by the linear expansion difference between the semiconductor laser 1 and the sub-mount substrate 20. This can realize the semiconductor laser light source with higher reliability which is capable of reducing the stress exerted on the semiconductor laser 1 after the bonding.

Figure 5:
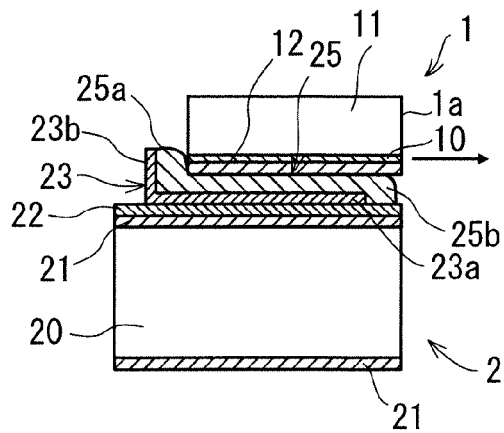
FIG. 5 is a view of an example of modification of the first preferred embodiment, which corresponds to FIG. 3.

Next, an example of modification of the first preferred embodiment will be described. As illustrated in FIG. 5, another intermediate layer 21 can be also placed on the lower surface of the sub-mount substrate 20. FIG. 5 is a view of the example of modification of the first preferred embodiment, which corresponds to FIG. 3. As described above, another intermediate layer 21 is also placed on the lower surface of the sub-mount substrate 20, namely the upper and lower intermediate layers 21 are placed with the sub-mount substrate 20 sandwiched therebetween, which enables fine adjustments of the linear expansion coefficient through the bimetal effect, thereby further reducing the stress exerted on the semiconductor laser 1 after the bonding. Since the stress exerted on the semiconductor laser 1 can be reduced, it is possible to improve the reliability of the semiconductor laser light source.

Second Preferred Embodiment

Figure 6:
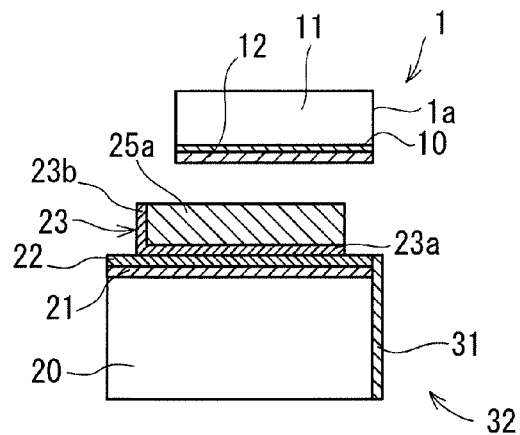
FIG. 6 is a cross-sectional view illustrating a semiconductor laser light source according to a second preferred embodiment in a state where a semiconductor laser has not been bonded to a sub-mount.
Figure 7:
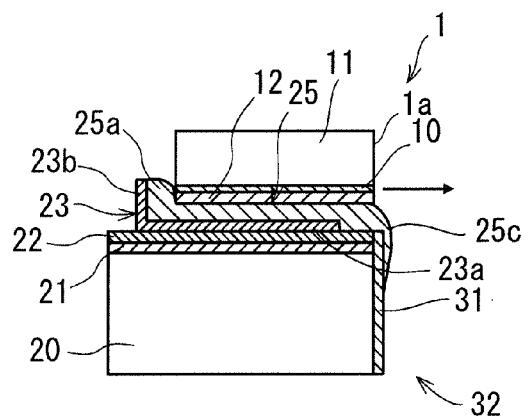
FIG. 7 is a cross-sectional view of the semiconductor laser light source according to the second preferred embodiment.

Next, a semiconductor laser light source according to a second preferred embodiment will be described. FIG. 6 is a cross-sectional view illustrating the semiconductor laser light source according to the second preferred embodiment in a state where a semiconductor laser 1 has not been bonded to a sub-mount 32. FIG. 7 is a cross-sectional view of the semiconductor laser light source according to the second preferred embodiment. Further, in the second preferred embodiment, the same components as those described in the first preferred embodiment are designated by the same reference characters and will not be described herein.

As illustrated in FIGS. 6 and 7, in the second preferred embodiment, an Au film 31 is placed on the side surface of the sub-mount 32 which coincides with an output end 1a of the semiconductor laser 1. Further, the other structures of the sub-mount 32 are the same as those in the structure of the sub-mount 2.

As described above, in the semiconductor laser light source according to the second preferred embodiment, the Au film 31 is placed on the side surface of the sub-mount 32 which corresponds to the side of the output end 1a of the semiconductor laser 1, which causes a redundant solder 25c after the bonding to spread with wetness along the Au film 31 on the side surface of the sub-mount 32. Even when there is an excessive amount of solder in a solder layer 25, it is possible to prevent an active layer 10 corresponding to the side of the output end 1a of the semiconductor laser 1 from being obstructed in the redundant solder 25c. This reduces the rate of occurrences of failures in semiconductor laser light sources, thereby increasing the yield.

Third Preferred Embodiment

Figure 8:
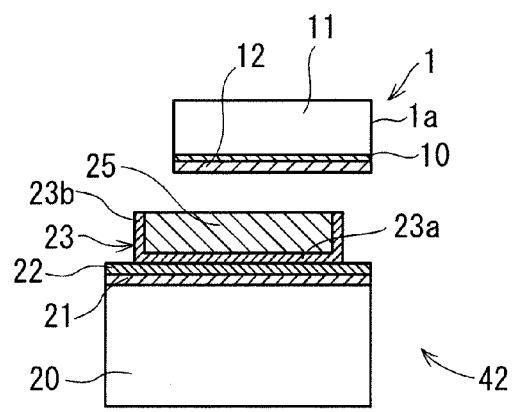
FIG. 8 is a cross-sectional view illustrating a semiconductor laser light source according to a third preferred embodiment in a state where a semiconductor laser has not been bonded to a sub-mount.
Figure 9:
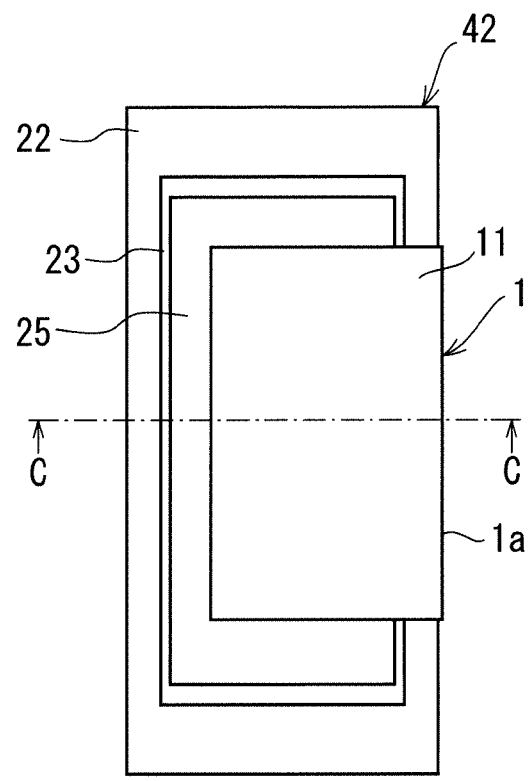
FIG. 9 is a plan view of the semiconductor laser light source according to the third preferred embodiment.
Figure 10:
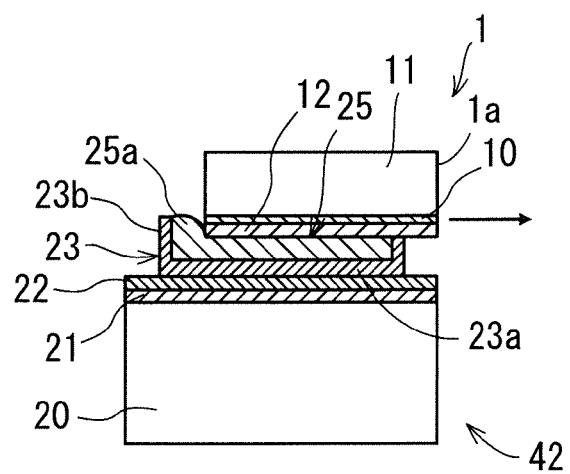
FIG. 10 is a cross-sectional view taken along the line C-C in FIG. 9.

Next, a semiconductor laser light source according to a third preferred embodiment will be described. FIG. 8 is a cross-sectional view illustrating the semiconductor laser light source according to the third preferred embodiment in a state where a semiconductor laser 1 has not been bonded to a sub-mount 42. FIG. 9 is a plan view of the semiconductor laser light source according to the third preferred embodiment. FIG. 10 is a cross-sectional view taken along the line C-C in FIG. 9. Further, in the third preferred embodiment, the same components as those described in the first and second preferred embodiments are designated by the same reference characters and will not be described herein.

As illustrated in FIGS. 8 to 10, in the third preferred embodiment, the sub-mount 42 includes a barrier layer 23 having a different structure from those according to the first and second preferred embodiments. The barrier layer 23 has a barrier portion 23b formed over the entire periphery of the outer peripheral portion of a horizontal portion 23a. Namely, the barrier portion 23b is formed over the outer peripheral portion of the horizontal portion 23a with a rectangular shape which corresponds to the four sides thereof. Further, the other structures of the sub-mount 42 are the same as those in the structure of the sub-mount 2.

The semiconductor laser 1 is bonded to the sub-mount 42, in a state where the output end 1a of the semiconductor laser 1 protrudes, in the direction of laser-light output, from the end of the barrier portion 23b which corresponds to the side of the output end 1a of the semiconductor laser 1 the output end 1a. The bonding of the semiconductor laser 1 to the sub-mount 42 is performed, by raising the temperature of the sub-mount 42 to a temperature equal to or higher than the temperature which melts the solder layer 25 and, further, by applying a load to the semiconductor laser 1. Therefore, after the bonding, the portion of the barrier portion 23b which coincides with the output end 1a of the semiconductor laser 1 has a height smaller than that of the other portion.

As described above, in the semiconductor laser light source according to the third preferred embodiment, the barrier portion 23b is formed over the entire periphery of the outer peripheral portion of the barrier layer 23, which causes a redundant solder 25a in the solder layer 25 to gather between the outer peripheral portion of the semiconductor laser 1 and the barrier portion 23b in the barrier layer 23, during the bonding of the semiconductor laser 1 to the sub-mount 42. This prevents the redundant solder 25a from spreading with wetness toward the output end 1a of the semiconductor laser 1, thereby further reducing failures due to the redundant solder 25a.

Therefore, even when the amount of the protrusion of the output end 1a of the semiconductor laser 1 is reduced, it is possible to prevent the occurrence of failures due to the redundant solder 25a. Since the semiconductor laser 1 is bonded to the sub-mount 42 over substantially the entire lower surface thereof, through the solder layer 25, it is possible to further improve the output characteristics and the reliability of the semiconductor laser light source.

While the invention has been shown and described in detail, the foregoing description is in all aspects illustrative and not restrictive. It is therefore understood that numerous modifications and variations can be devised without departing from the scope of the invention.

What is claimed is:

1. A semiconductor laser light source comprising:
   a semiconductor laser having an output end for outputting laser light; and
   a sub-mount to which said semiconductor laser is bonded; wherein
   said sub-mount includes a sub-mount substrate, an Au layer placed above said sub-mount substrate, a barrier layer which is placed on said Au layer and having a wall portion, and a generally planar solder layer bounded by edges and placed on said barrier layer in an area surrounded by said wall portion, and
   said semiconductor laser is bonded to said sub-mount through said solder layer with the end emitting the laser light generally parallel to the plane of the solder layer,
   the wall portion of said barrier layer extending upwardly with respect to the generally planar solder layer at an edge thereof remote from said output end of the semiconductor laser; the semiconductor laser being bonded to said sub-mount by said solder layer with its output end protruding over the edge of the solder layer, in a direction of output of said laser light.

2. The semiconductor laser light source according to claim 1, wherein
   an Au film is placed on a side surface of said sub-mount which corresponds to the side of said output end of said semiconductor laser.

3. The semiconductor laser light source according to claim 1, wherein
   said wall portion is formed over an entire periphery of an outer peripheral side edge of said barrier layer.

4. A semiconductor laser light source comprising:
   a semiconductor laser having an output end for outputting laser light; and
   a sub-mount to which said semiconductor laser is bonded;
   wherein said sub-mount includes a sub-mount substrate, an Au layer placed above said sub-mount substrate, a barrier layer which is placed on said Au layer and having a wall portion at least in a portion of its outer peripheral portion which is other than a portion corresponding to a side of said output end of said semiconductor laser, and a solder layer placed on said barrier layer in an area surrounded by said wall portion, and said semiconductor laser is bonded to said sub-mount through said solder layer, in a state where said semiconductor laser is spaced apart by a predetermined interval from an inner surface of said wall portion, and further, said output end protrudes, in a direction of output of said laser light, from an end of said solder layer which corresponds to the side of said output end of said semiconductor laser, wherein the semiconductor laser light source further includes an intermediate layer which is placed between said sub-mount substrate and said Au layer and is formed from a Ti-layer/Cu-layer/Ni-layer, reducing a stress strain during the bonding, which is caused by a linear expansion difference between said semiconductor laser and said sub-mount substrate.

5. The semiconductor laser light source according to claim 4, wherein said intermediate layer is also placed on a lower surface of said sub-mount substrate.

\* \* \* \* \*